(12) United States Patent
Takeshima et al.

(10) Patent No.: US 6,223,406 B1
(45) Date of Patent: May 1, 2001

(54) METHOD OF MANUFACTURING PIEZOELECTRIC RESONATOR

(75) Inventors: Tetsuo Takeshima, Toyama; Takeshi Yamazaki, Ishikawa-ken; Shigemasa Kusabiraki, Takoaka; Yutaka Kawai, Hakui, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/159,906

(22) Filed: Sep. 24, 1998

(30) Foreign Application Priority Data

Oct. 3, 1997 (JP) .................................. 9-287668

(51) Int. Cl.[7] .................................................. H04R 17/00
(52) U.S. Cl. ..................... 29/25.35; 333/187; 333/189; 310/321; 310/348; 310/359; 310/366; 310/367
(58) Field of Search ........................ 333/187, 189–192; 310/311, 321, 328, 348, 357, 359, 366, 367; 29/25.35

(56) References Cited

U.S. PATENT DOCUMENTS 3,590,287 * 6/1971 Belincourt ............................ 330/30
4,087,716 * 5/1978 Heywang ............................. 310/332
4,360,754 * 11/1982 Toyoshima et al. ................. 310/366
4,633,120 * 12/1986 Sato ..................................... 310/328
5,900,790 * 5/1999 Unami et al. ....................... 333/187

* cited by examiner

*Primary Examiner*—Lee Young
*Assistant Examiner*—Sean Smith
(74) *Attorney, Agent, or Firm*—Keating & Bennett, LLP

(57) ABSTRACT

A method of manufacturing a resonance element includes the steps of preparing a multilayered body having a plurality of piezoelectric layers and a plurality of inner electrodes laminated to each other, forming an insulating film on one surface of the multilayered body at exposed portions of the inner electrodes, the insulating film having a plurality of openings constituting substantially parallel rows which are substantially parallel to the laminating direction of the multilayered body, forming an outer electrode on substantially the entire surface on which the insulating film is formed, forming a plurality of grooves on the surface on which the outer electrode is formed and cutting the multilayered body substantially parallel to the grooves, wherein a first group of the openings in a first of the rows are disposed on every alternate exposed portion of the internal electrodes, and a second group of remaining openings in a second row adjacent to the first row are disposed on each of the remaining alternate exposed portions of the internal electrodes, the first and second row are separated from each other by a predetermined distance and the groove is formed between the first and second rows.

18 Claims, 14 Drawing Sheets

METHOD OF MANUFACTURING PIEZOELECTRIC RESONATOR

BACKGROUND OF THE INVENTION

1. Field of the Invention

The present invention relates to a method of manufacturing a piezoelectric resonator. More particularly, the present invention relates to a method of manufacturing a piezoelectric resonator which is provided in electronic components, such as an oscillator, a discriminator, and a filter, and which uses mechanical resonance of a piezoelectric body.

2. Description of the Related Art

FIG. 26 is a perspective view showing an example of a conventional piezoelectric resonator. A piezoelectric resonator 1 shown in FIG. 26 includes a piezoelectric substrate 2, for example, having a rectangular plate shape. The piezoelectric substrate 2 is polarized along the thickness direction thereof. Electrodes 3 are provided on both major surfaces of the piezoelectric substrate 2. As a result of inputting a signal between these electrodes 3, an electric field is applied along the thickness direction of the piezoelectric substrate 2, causing the piezoelectric substrate 2 to vibrate along the length direction thereof.

The piezoelectric resonator shown in FIG. 26 is an unstiffened type, in which the vibration direction is different from the electric-field direction and the polarization direction. An electro-mechanical coupling coefficient of a piezoelectric resonator of such an unstiffened resonator is lower than that of a stiffened piezoelectric resonator, in which the electric-field direction, the polarization direction, and the vibration direction coincide with each other. Therefore, in the unstiffened type piezoelectric resonator, the difference ΔF between the resonance frequency and the anti-resonance frequency is relatively small. This causes a very small bandwidth when such an unstiffened piezoelectric resonator is used for a filter. Therefore, the degree of characteristic design freedom is small in such an unstiffened piezoelectric resonator and electronic components incorporating such a resonator.

Furthermore, in the piezoelectric resonator shown in FIG. 26, a primary resonance of a length mode is used. However, due to the structure of the resonator shown in FIG. 26, an odd-number multiple high-order mode, such as a third order mode or a fifth order mode, and a large spurious vibration of a width mode, are generated.

Japanese Patent Application No. 8-110475, filed by the applicant of the present invention, describes a piezoelectric resonator having a multilayered base structure having a longitudinal direction which is provided as a result of a plurality of piezoelectric layers and a plurality of electrodes being alternately stacked and laminated. The plurality of piezoelectric layers are polarized along the length direction of the base, and a fundamental vibration of a longitudinal vibration is excited. The piezoelectric resonator of such a multilayered structure is a stiffened type resonator, in which the polarization direction, the electric-field direction, and the vibration direction are the same. As a result, such a stiffened resonator has spurious emissions that are smaller than that of an unstifffened type resonator, and the difference ΔF between the resonance frequency and the anti-resonance frequency is large in this stiffened type resonator.

Next, an example of a piezoelectric resonator having such a multilayered structure will be described in detail. FIG. 1 is a perspective view showing an example of a conventional piezoelectric resonator having a multilayered structure, to provide a background against which-the present invention will be compared later. FIG. 2 is a schematic view of the piezoelectric resonator. FIG. 3 is a plan view of the essential portion of the piezoelectric resonator.

A piezoelectric resonator 10 in FIG. 1 having such a multilayered structure includes a base 12, for example, having a rectangular body. The base 12 includes a plurality of piezoelectric layers 12a, which are formed from, for example, a piezoelectric ceramic, and are multilayered. In the plurality of piezoelectric layers 12a in the intermediate portion along the length direction of the base 12, a plurality of internal electrodes 14 are disposed on each of the two main surfaces so as to be perpendicular relative to the length direction of the base 12. Therefore, a plurality of internal electrodes 14 are disposed and spaced apart in a direction that is perpendicular to the length direction of the base 12 and along the length direction of the base 12. Also, the plurality of piezoelectric layers 12a in the intermediate portion along the length direction of the base 12, as indicated by the arrows in FIG. 2, are polarized along the length direction of the base 12 so that adjacent piezoelectric layers are oppositely polarized relative to each other on both sides of the respective internal electrodes 14. However, the piezoelectric layers 12a of both end portions along the length direction of the base 12 are not polarized. In this base 12, the internal electrodes 14 are exposed at four side surfaces which are parallel to the length direction of the base 12.

A groove 15 which extends along the length direction of the base 12 is formed on one side surface of the base 12. The groove 15 is formed in the center in the width direction of the base 12, dividing one side surface of the base 12 into two portions. Furthermore, as shown in FIG. 2, a first insulation film 16 and a second insulation film 18 are disposed on the side surfaces divided by the groove 15. On one side divided by the groove 15 on the side surface of the base 12, every alternate exposed portion of the internal electrodes 14 is covered by the first insulation film 16. Also, on the other side divided by the groove 15 on the side surface of the base 12, the exposed portions of the internal electrodes 14 that are not covered by the first insulation film 16 on one side of the groove 15 are covered by the second insulation film 18.

Furthermore, at the portions where the first and second insulation films 16 and 18 of the base 12 are disposed, that is, on both sides of the groove 15, two external electrodes 20 and 22 are disposed. Therefore, the internal electrodes 14 that are not covered by the first insulation film 16 are connected to the external electrode 20, and the internal electrodes 14 that are not covered by the second insulation film 18 are connected to the external electrode 22. That is, adjacent internal electrodes 14 are connected to the external electrode 20 and the external electrode 22, respectively.

In this piezoelectric resonator 10, the external electrodes 20 and 22 are used as input and output electrodes. In the intermediate portion along the length direction of the base 12, since the section between adjacent internal electrodes 14 is polarized and an electric field is applied between the adjacent internal electrodes 14, the section is piezoelectrically active. Since mutually opposite voltages are applied to the portions of the base 12 which are mutually oppositely polarized, the base 12 expands or contracts in the same direction as a whole. Therefore, in the entire piezoelectric resonator 10, a fundamental vibration in a longitudinal vibration mode, in which the center portion along the length direction of the base 12 is a node, is excited. Both end portions along the length direction of the base 12 are not polarized, and an electric field is not applied thereto because no electrode is disposed at the end portions. Therefore, both end portions are piezoelectrically inactive.

In this piezoelectric resonator 10, the polarization direction of the base 12, the electric-field direction applied by the input signal, and the vibration direction of the base 12 are the same. That is, this piezoelectric resonator 10 is a stiffened piezoelectric resonator. This piezoelectric resonator 10 has an electro-mechanical coupling coefficient greater than that of an unstiffened type, such that the polarization direction, the electric-field direction, and the vibration direction are different from each other. Therefore, in this piezoelectric resonator 10, it is possible to increase the selectable width of the difference ΔF between the resonance frequency and the anti-resonance frequency in comparison with an unstiffened piezoelectric resonator. Therefore, in this piezoelectric resonator 10, it is possible to obtain a characteristic with a larger bandwidth than that of an unstiffened resonator. Furthermore, this piezoelectric resonator 10 has spurious emissions which are smaller than that of an unstiffened resonator. In addition, in this. piezoelectric resonator 10, since the external electrodes 20 and 22 are disposed on a single common side surface thereof, the resonator 10 can be surface-mounted onto, for example, an insulator substrate.

A method of manufacturing this piezoelectric resonator 10 will be described below with reference to FIGS. 4 to 13. In these figures, for convenience of description, the number of layers of green sheets which form the piezoelectric layers 12a does not coincide with the number of layers of the piezoelectric layers 12a which form the piezoelectric resonator 10 shown in FIGS. 2 and 3. However, the following manufacturing process is the same regardless of the number of piezoelectric layers.

When manufacturing this piezoelectric resonator 10, as shown in FIG. 4, a green sheet 30 is prepared first. Conductive paste containing, for example, silver, palladium, an organic binder, and the like, is coated onto one surface of the green sheet 30, forming a conductive paste layer 32. The conductive paste layer 32 is formed on the entire surface excluding one end side of the green sheet 30. A plurality of the green sheets 30 are stacked in layers. At this time, the green sheets 30 are multilayered so that alternate end portions which are not formed with the conductive paste layer 32 are disposed in mutually opposite directions. Furthermore, since a conductive paste is coated onto the opposing side surfaces of the multilayered body and then sintered, a multilayered base 34 such as that shown in FIG. 5 is formed.

Inside the multilayered base 34, as a result of the conductive paste layer 32 being sintered, a plurality of internal electrodes 36 are formed. These internal electrodes 36 are alternately exposed at the opposing portions of the multilayered base 34. Then, in the opposing portions of the multilayered base 34, electrodes 38 and 40 for polarization are formed, to which each alternate internal electrode 36 is connected. By applying a direct-current voltage to these polarization electrodes 38 and 40, a polarization process is performed on the multilayered base 34. At this time, inside the multilayered base 341 a direct-current high electric-field is applied between adjacent internal electrodes 36, and the directions of the applied electric field are opposite to each other. Therefore, the multilayered base 34 is polarized in mutually opposite directions on both sides of the internal electrodes 36, as indicated by the arrows in FIG. 5.

Next, as indicated by the dotted line in FIG. 6, the multilayered base 34 is cut by a dicer or the like in such a manner as to intersect at right angles to the plurality of internal electrodes 36 and the polarization electrodes 38 and 40. As a result, a multilayered body 42 such as that shown in FIG. 7 is formed.

Then, as shown in FIG. 8, an insulation film 44 is arranged in such a manner as to form a checkered pattern on one main surface of the multilayered body 42. In this case, in one row in the vertical direction with respect to the internal electrodes 36 of a checkered pattern, the insulation film 44 is disposed on alternate internal electrodes 36 in the vertical direction with respect to the internal electrodes 36 of the multilayered body 42. Also, in a row which is vertical with respect to the adjacent internal electrodes 36 of the multilayered body 42, the insulation film 44 is formed on the internal electrodes 36 which are not covered with the insulation film 44 in the adjacent row.

Thereafter, in this multilayered body 42, on the entire surface where the insulation film 44 is formed, as shown in FIG. 9, an external electrode 48 is formed by sputtering or the like.

Next, in the multilayered body 42, the groove 15 is formed so as to intersect at right angles to the surface of the internal electrodes 36 by a dicing machine in the portion indicated by the one-dot-chain line in FIG. 10, specifically, in the portion between the one-dot-chain lines of FIG. 11, that is, on the main surface of the multilayered body 42 in the boundary portion of adjacent rows of the insulation film 44 arranged in a checkered pattern, and further, by cutting the multilayered body 42 as shown in FIG. 12, the piezoelectric resonator 10 shown in FIGS. 1 and 2 is formed in the portion indicated by the dotted line in FIG. 10, specifically, in the portion between the one-dot-chain lines of FIG. 11, that is, in the intermediate portion of these grooves 15.

However, in the above-described method, when the position at which the groove 15 is formed in the multilayered body 42 is deviated by ½ or more of the edge thickness (corresponding to the width of the groove 15) of a dicing machine, for example, as shown in FIG. 13, the groove 15 is deviated from the boundary of the adjacent rows of the insulation film 44. In this case, in the piezoelectric resonator 10 to be formed, as shown in FIG. 14, the internal electrodes 36 (14) to be insulated are not insulated completely by the insulation film 44 (16), and the section between external electrodes 48 (20) and 48 (22) is short-circuited. In this manner, in the above-described method, the groove 15 must be formed so as to include the edge of the insulation film 44, and the position at which the groove 15 is formed requires high accuracy, making it difficult to manufacture the piezoelectric resonator 10 with a high yield of non-defective products.

SUMMARY OF THE INVENTION

To overcome the problems with conventional devices described above, the preferred embodiments of the present invention provide a method of manufacturing a piezoelectric resonator, such that a surface-mountable piezoelectric resonator having a multilayered structure can easily be manufactured accurately and with a high yield of non-defective products.

The preferred embodiments of the present invention provide a method of manufacturing a resonance element, including the steps of preparing a multilayered body having a plurality of piezoelectric layers and a plurality of inner electrodes laminated to each other, forming an insulating film on one surface of the multilayered body at exposed portions of the inner electrodes, the insulating film having a plurality of openings constituting substantially parallel rows which are substantially parallel to the laminating direction of the multilayered body, forming an outer electrode on substantially the entire surface on which the insulating film is located, forming a plurality of grooves on the surface on which the outer electrode is located and cutting the multi-layered body substantially parallel to the grooves, wherein a first group of the openings in a first of the rows are disposed on each alternate exposed portion of the internal electrodes, and a second group of the openings in a second row adjacent to the first row are disposed on each of the remaining alternate exposed portions of the internal electrodes, the first and second rows being separated from each other by a predetermined distance, and the groove is located between the first and second rows.

In the above described method, a relationship $0<x<(W-a)/2$ is preferably satisfied where W is the width of the piezoelectric resonator, a is the width of the groove, and x is the dimension of the predetermined distance between the first row and the adjacent second row.

According to preferred embodiments of the present invention, a surface-mountable piezoelectric resonator having a multilayered structure is manufactured.

Also, in a method of manufacturing a piezoelectric resonator in accordance with preferred embodiments of the present invention, an insulation film is formed in such a way that the first and second rows are separated by a predetermined distance. Therefore, even if the position at which a groove is formed in the multilayered body is slightly deviated from a predetermined position, no short-circuit occurs between electrodes, and it is easy to manufacture a piezoelectric resonator with a high yield of non-defective products.

Other features and advantages of the present invention will become apparent from the following description of preferred embodiments of the present invention which refers to the accompanying drawings.

DETAILED DESCRIPTION OF PREFERRED EMBODIMENTS

A preferred embodiment of a method of manufacturing a piezoelectric resonator similar to the piezoelectric resonator 10 shown in FIGS. 1 and 12 will now be described.

Figure 1:
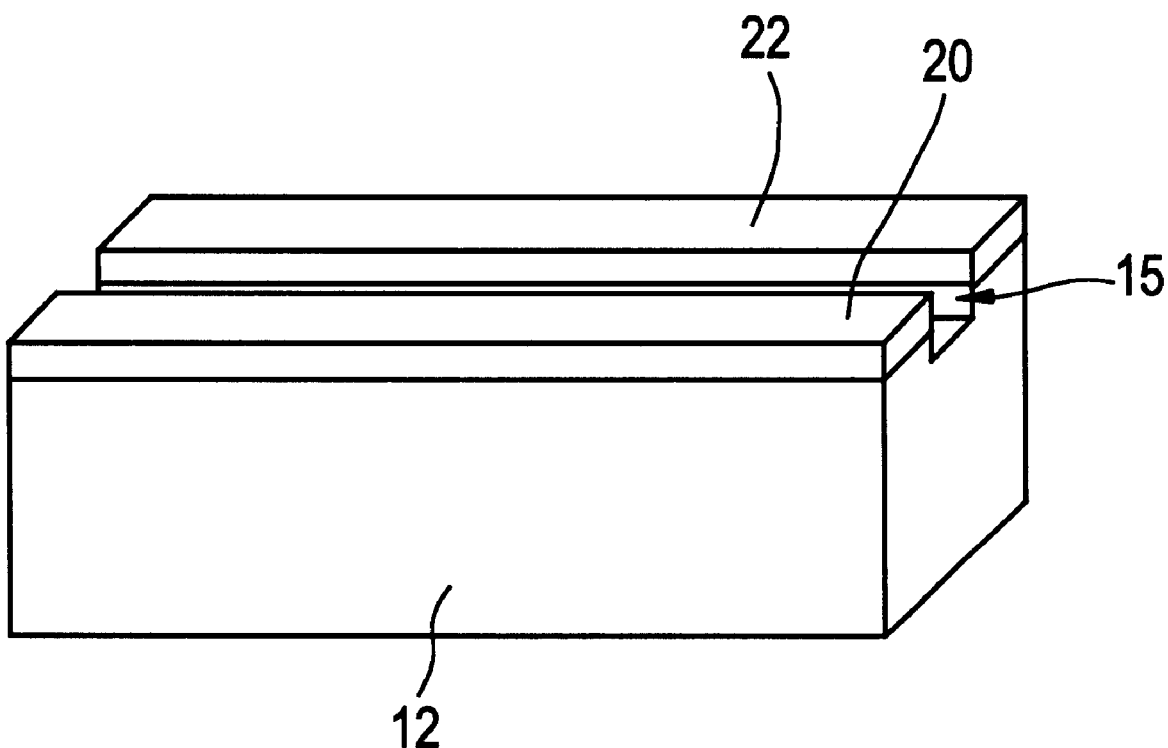
FIG. 1 is a perspective view showing an example of a piezoelectric resonator relating to a background of the present invention.
Figure 2:
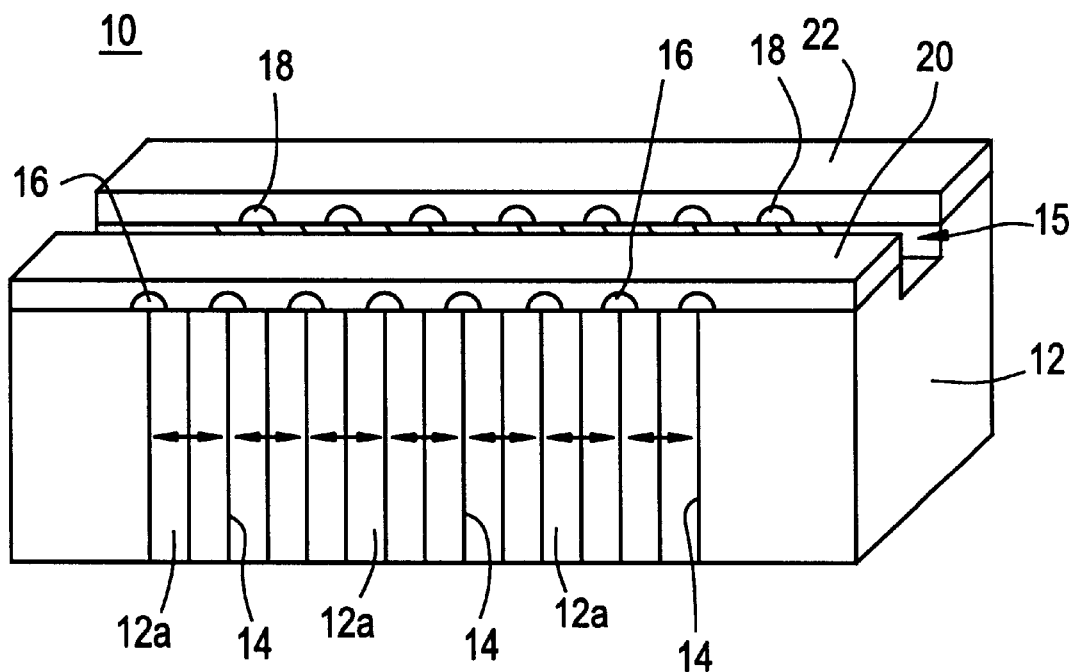
FIG. 2 is a schematic view of the piezoelectric resonator shown in FIG. 1.
Figure 3:
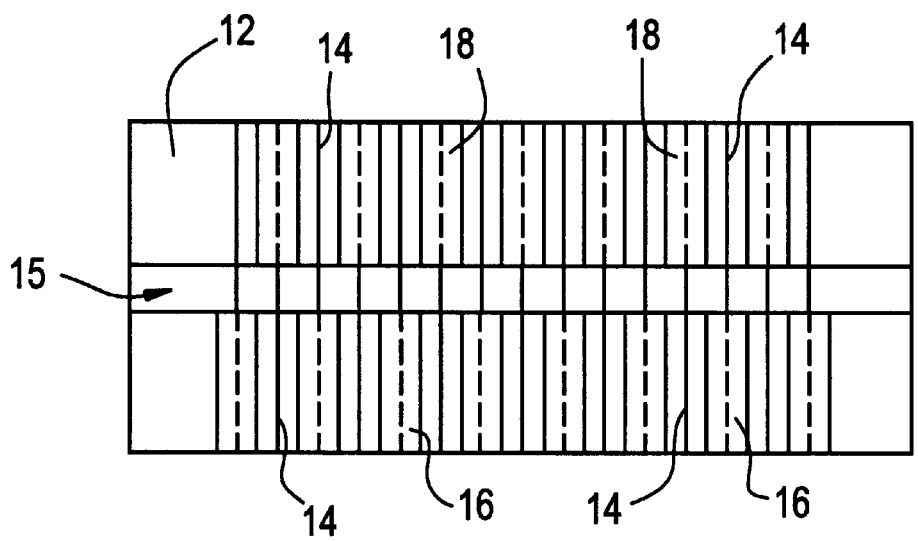
FIG. 3 is a plan view of the essential portion of the piezoelectric resonator shown in FIG. 1.
Figure 4:
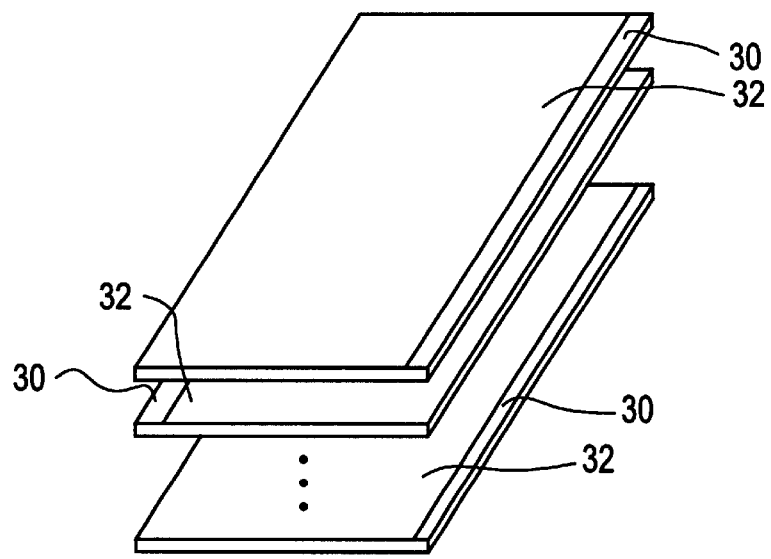
FIG. 4 is a perspective view showing a state in which ceramic green sheets and the like are stacked and laminated to produce a piezoelectric resonator.
Figure 5:
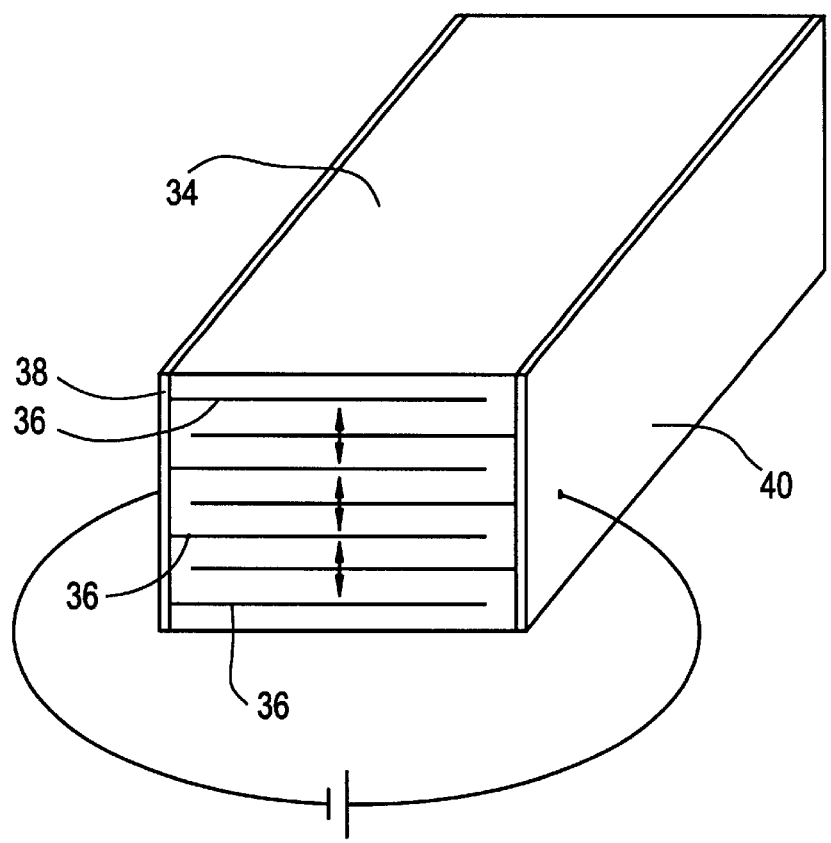
FIG. 5 is a schematic view showing a multilayered base made from ceramic green sheets shown in FIG. 4.
Figure 6:
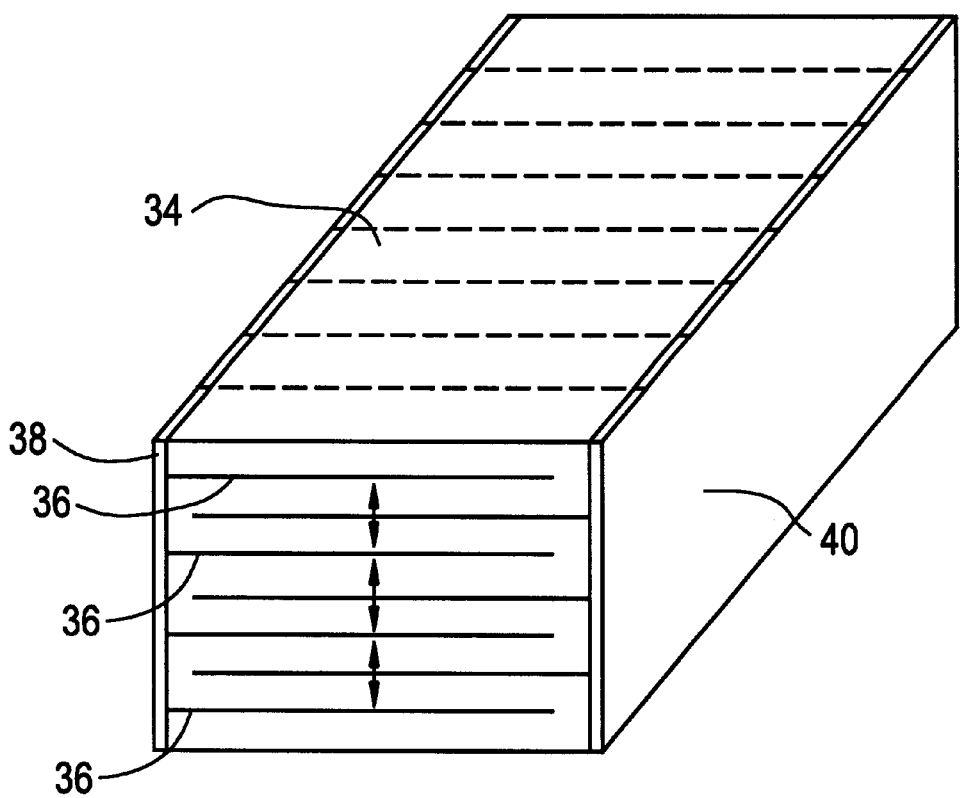
FIG. 6 is a schematic view showing a portion where the multilayered base shown in FIG. 4 is cut.
Figure 7:
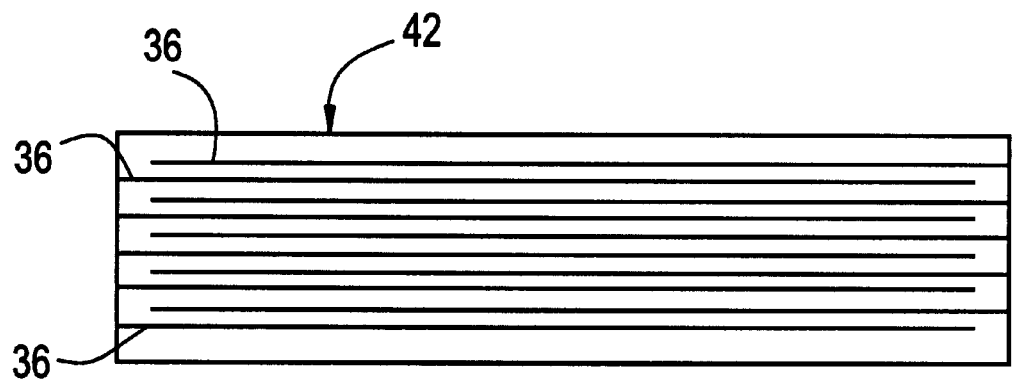
FIG. 7 is a schematic view showing a multilayered base such that the multilayered base shown in FIG. 6 is cut.
Figure 12:
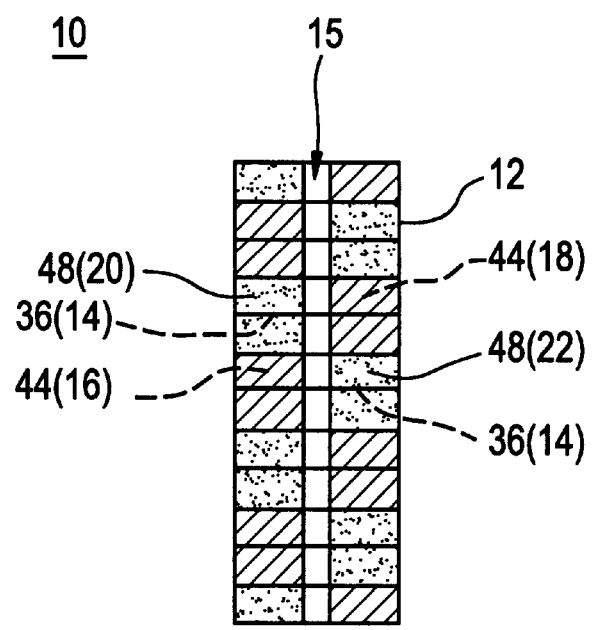
FIG. 12 is a schematic view showing the piezoelectric resonator manufactured in the step shown in FIG. 11.
Figure 13:
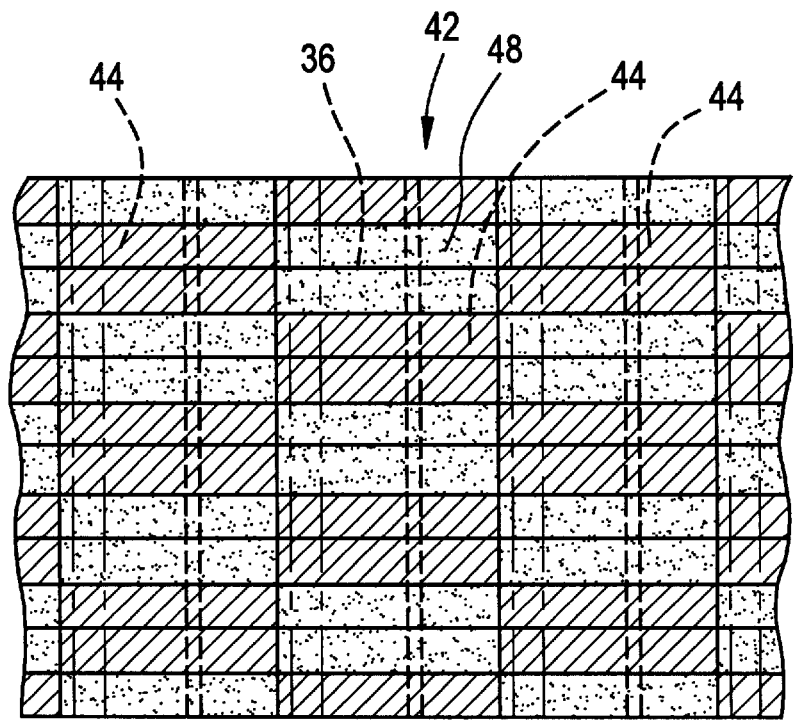
FIG. 13 is a schematic view of the essential portion showing a step in a case in which the position at which a groove is formed in the multilayered base and the position at which the multilayered base is cut are deviated in the step shown in FIG. 11.
Figure 14:
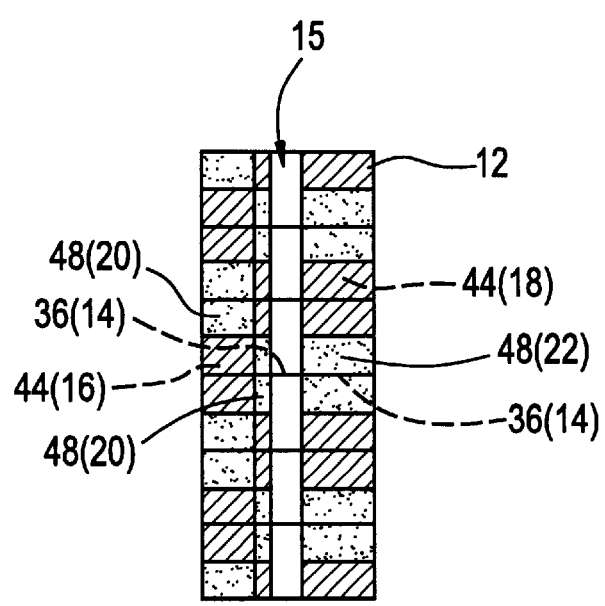
FIG. 14 is a schematic view showing the piezoelectric resonator manufactured in the step shown in FIG. 13.

Initially, a multilayered body 42 shown in FIG. 7 is made by the same steps as used in a method of manufacturing the piezoelectric resonator 10 shown in FIGS. 1 and 12.

Figure 8:
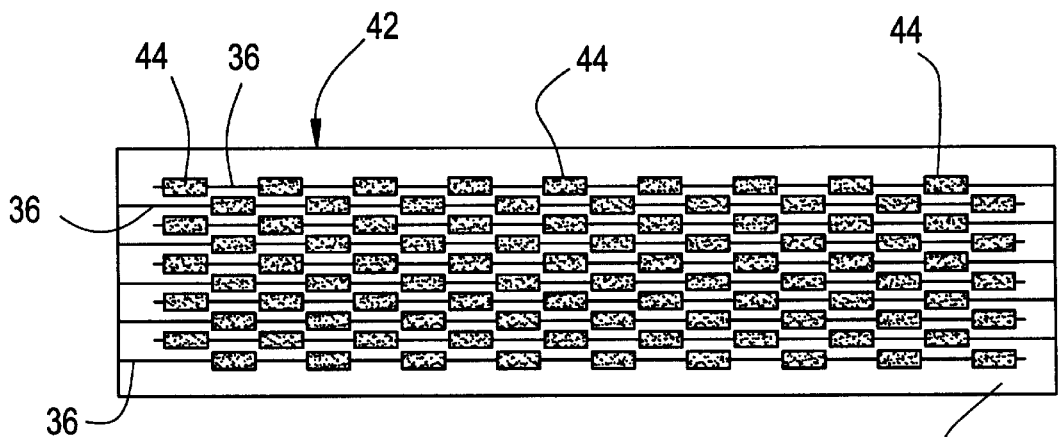
FIG. 8 is a schematic view showing a state in which an insulation film is disposed in the multilayered base shown in FIG. 7.
Figure 9:
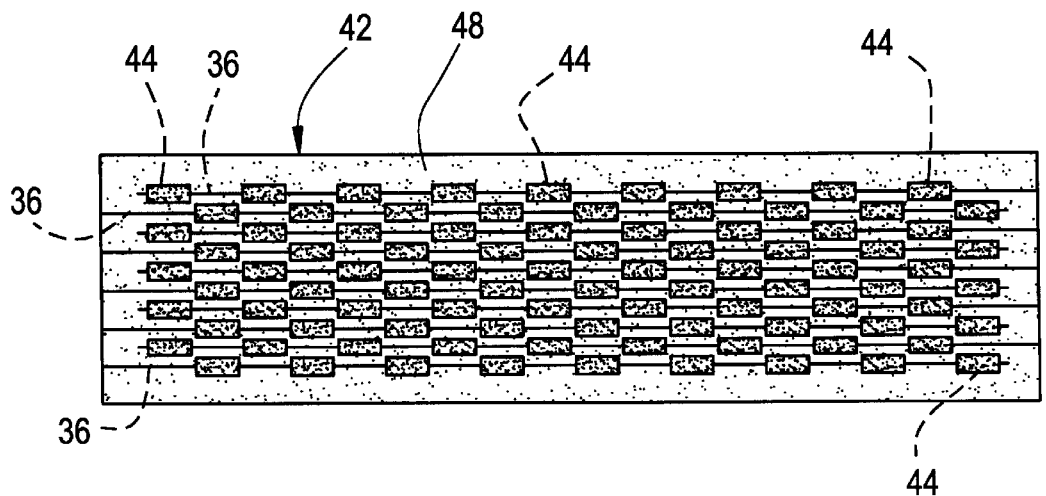
FIG. 9 is a schematic view showing a state in which an external electrode is disposed in the multilayered base shown in FIG. 8.
Figure 10:
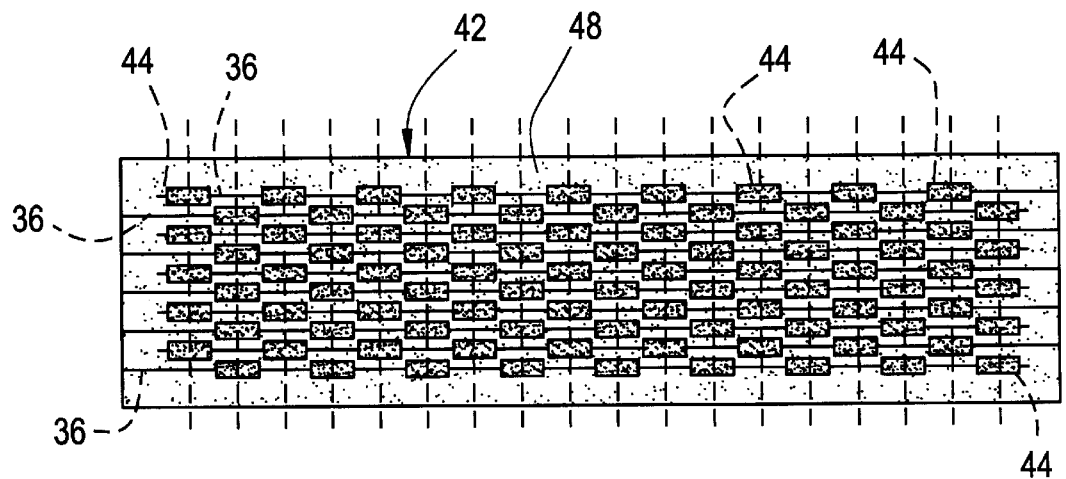
FIG. 10 is a schematic view showing a step for manufacturing a piezoelectric resonator by forming a groove in the multilayered base shown in FIG. 9 and cutting the multilayered base.
Figure 11:
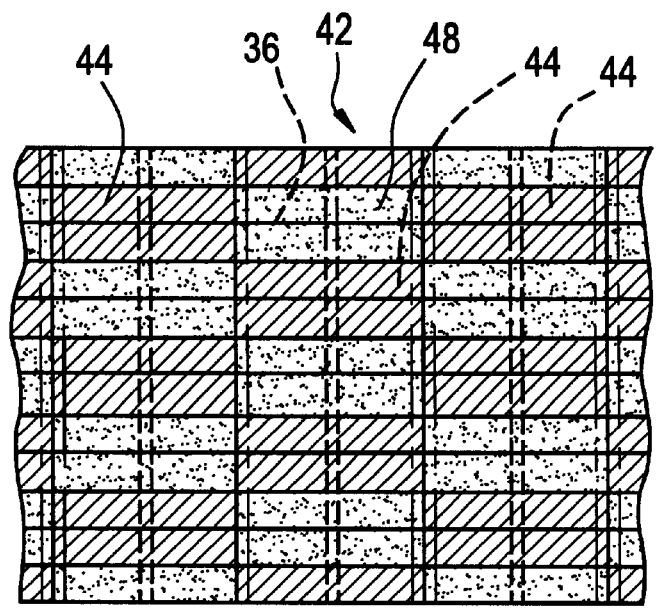
FIG. 11 is a schematic view of the essential portion of the step shown in FIG. 10.

Then, as shown in FIG. 15E an insulation film 44 is formed on one surface of this multilayered body 42 in such a way that overlapping portions 46 which are continuous in a vertical direction with respect to the internal electrodes 36 are provided instead of the checkered pattern shown in FIG. 8. That is, a first row of openings at 48(20) and a second row of openings at 48(22) adjacent to the first row of openings at 48(20), each of which rows is substantially parallel to the laminating direction of the multilayered body, are separated from each other by a predetermined distance.

Figure 15:
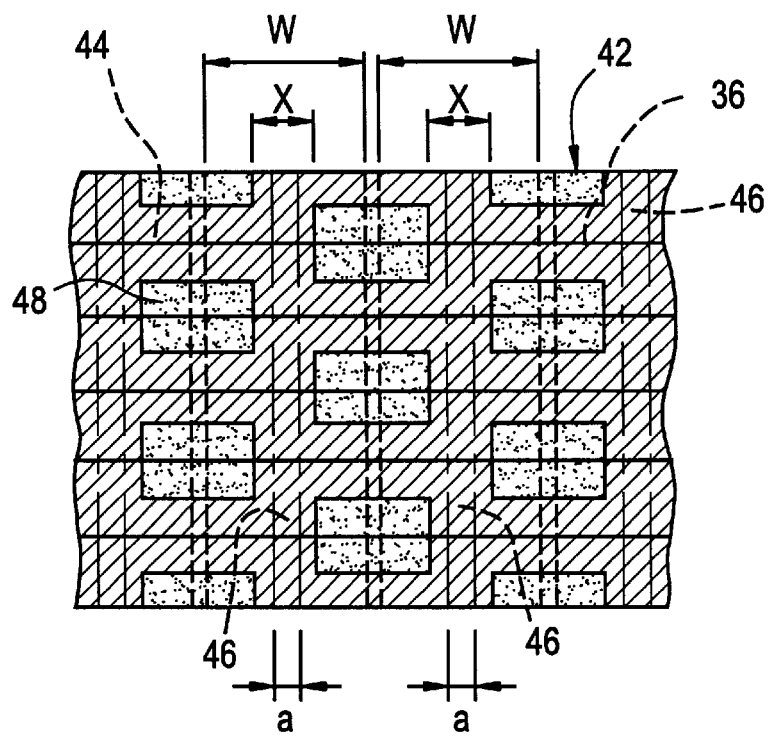
FIG. 15 is a schematic view of the essential portion showing a step for manufacturing a piezoelectric resonator by forming a groove in the multilayered base and cutting the multilayered base in the method of manufacturing a piezoelectric resonator according to preferred embodiments of the present invention.

Thereafter, in this multilayered body 42, as shown in FIG. 15, external electrodes 48 are formed by sputtering or similar processes on the entire surface of the surface where the insulation film 44, including the overlapping portion 46, is formed.

Figure 16:
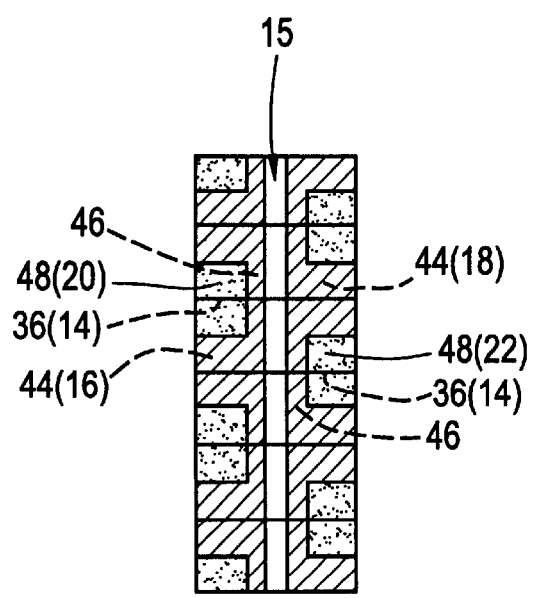
FIG. 16 is a schematic view showing the piezoelectric resonator manufactured by the process shown in FIG. 15.

Next, in the multilayered body 42, a groove 15 is formed by a dicing machine so as to intersect at right angles to the surface of the internal electrodes 36 in the portion indicated by the one-dot-chain line in FIG. 15, that is, in an approximately central portion of the overlapping portions 46 of the insulation film 44, and in the portion between the dotted lines in FIG. 15, that is, in the intermediate portion of the grooves 15, by cutting the multilayered body 42, a piezoelectric resonator 10' shown in FIG. 16 is formed.

In comparison with the piezoelectric resonator 10 shown in FIG. 1, in the piezoelectric resonator 10' shown in FIG. 16, the overlapping portions 46 of the insulation film 44 remain on both sides of the groove 15. However, since the internal electrodes 36 (14) are not completely insulated in the overlapping portion 46, the internal electrodes 36 (14) do not cause a connection failure. As a result, the piezoelectric resonator 10' becomes similar to the piezoelectric resonator 10 shown in FIG. 1, and has similar functions.

Figure 17:
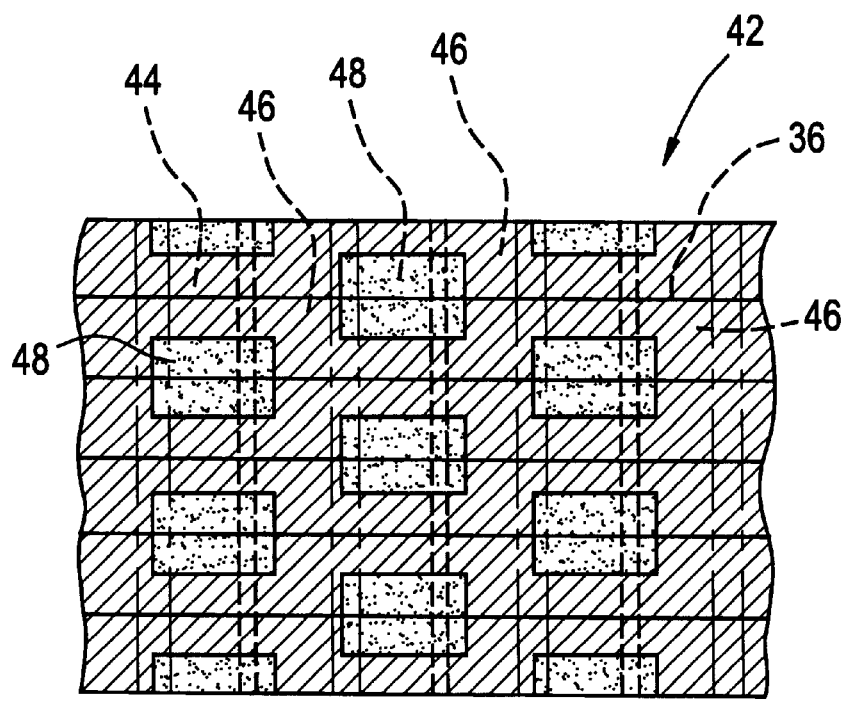
FIG. 17 is a schematic view of the essential portion showing a step in a case in which the position of a groove and cutting position are deviated in the step shown in FIG. 15.
Figure 18:
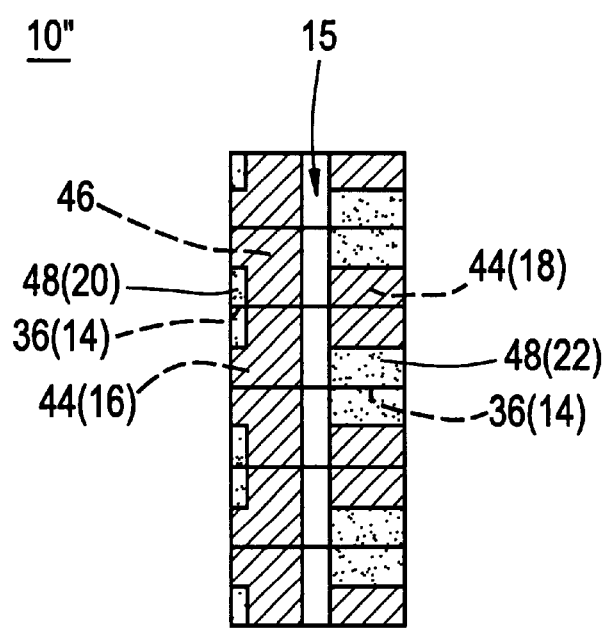
FIG. 18 is a schematic view showing the piezoelectric resonator manufactured by the process shown in FIG. 17.

In the above-described method which is a preferred embodiment of the present invention, when the width of the piezoelectric resonator is denoted as W, the width of the groove is denoted as a, and the width of the overlapping portion 46 of the insulation film 44 is denoted as x, $0<x<(W-a)/2$ is preferably satisfied. Therefore, even if the position at which the groove 15 is formed in the multilayered body 42 is deviated by ½ or more of the edge thickness of the dicing machine, it is not deviated completely from the overlapping portion 46 of the insulation film 44, as shown, for example, in FIG. 17. In this case, in a piezoelectric resonator 10" to be formed, as shown in FIG. 18, the overlapping portions 46 of the insulation film 44 are left on one side of the groove 15. However, the internal electrodes 36 (14) are not completely insulated in the overlapping portion 46, the internal electrodes 36 (14) are exposed on the other side of the base 12, and the internal electrodes 36 (14) do not cause a connection failure. As a result, the piezoelectric resonator 10" becomes substantially the same as the piezoelectric resonator 10 shown in FIG. 1, and has similar functions.

Therefore, in the above-described method which is a preferred embodiment of the present invention, even if the position at which the groove 15 is formed is slightly deviated from a predetermined position (the approximately central portion along a direction that is substantially parallel to the internal electrodes of the overlapping portions of the insulation film), a short-circuit does not occur between the electrodes, and it is easy to manufacture a surface-mountable piezoelectric resonator of a multilayered structure with a high yield of non-defective products.

Figure 19:
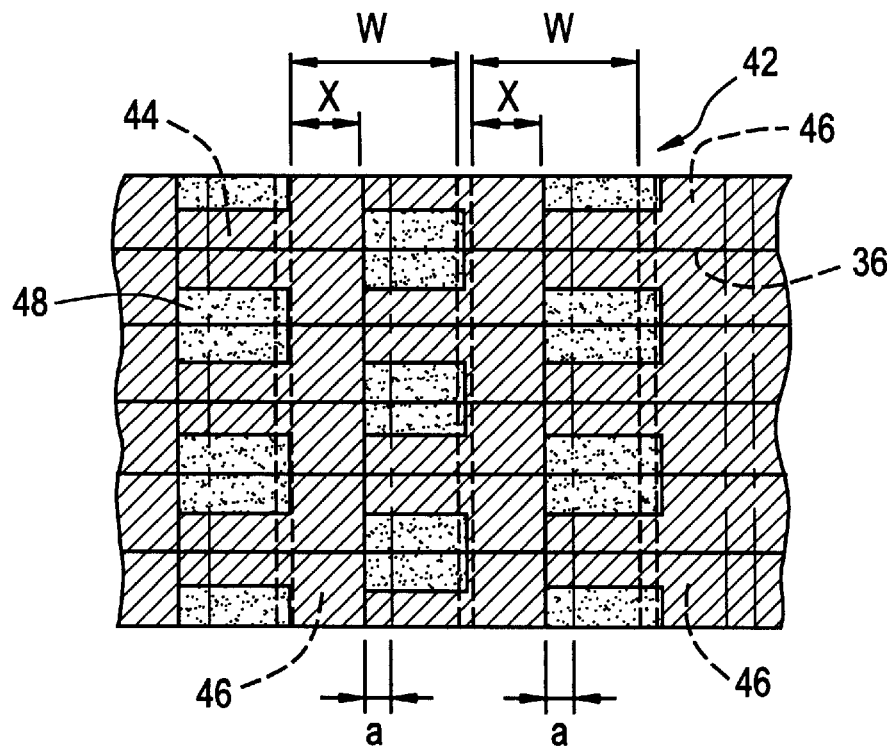
FIG. 19 is a schematic view of the essential portion showing a step in a case in which the position of a groove and cutting position are deviated in the step shown in FIG. 15.
Figure 20:
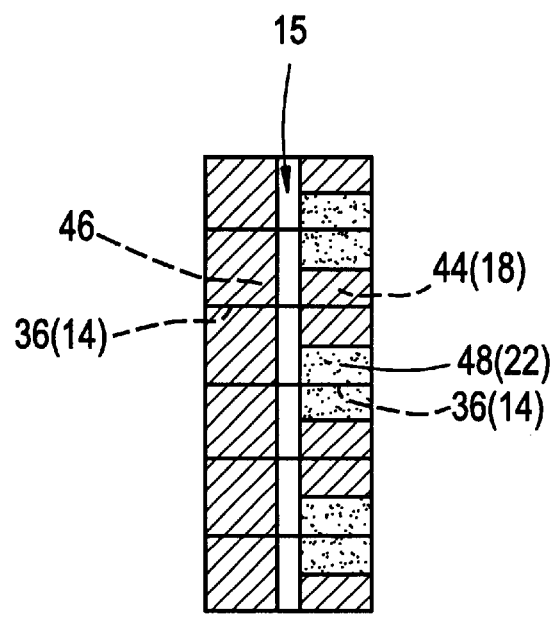
FIG. 20 is a schematic view showing the piezoelectric resonator manufactured by the process shown in FIG. 19.

When, as shown in FIG. 19, the groove 15 is formed alongside the overlapping portion 46 of the insulation film 44, if the dimension x of the overlapping portion 46 is $(W-a)/2$ or more, the internal electrodes 36 (14) are completely insulated in the overlapping portions 46, as shown in FIG. 20.

Even in such a case, if the dimension x of the overlapping portion 46 of the insulation film 44 is set such that $0<x<(W-a)/2$, the internal electrodes 36 (14) are not insulated completely.

Also in preferred embodiments of the present invention, if the thickness a of the edge for forming the groove 15 is formed to be larger than the width x of the overlapping portion 46 of the insulation film 44, in the case where the groove 15 is formed at a predetermined position, it is possible to obtain a piezoelectric resonator 10 having no overlapping portion 46 of the insulation film 44. In such a case, even if the groove 15 is formed at a position that is deviated slightly from a predetermined desired position, it is possible to obtain a piezoelectric resonator 10 having no overlapping portion 46 of the insulation film 44.

Figure 21:
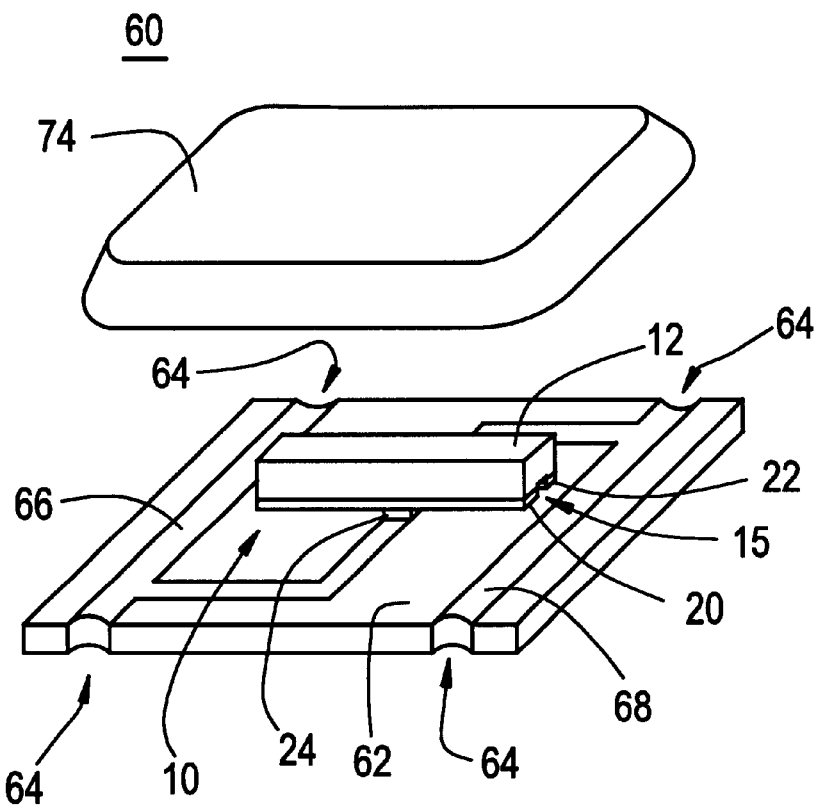
FIG. 21 is an exploded perspective view showing an example of an electronic component including the piezoelectric resonator shown in FIG. 1.

By using the above-described piezoelectric resonator 10, an electronic component, such as an oscillator and a discriminator, is manufactured. FIG. 21 is a perspective view showing an example of an electronic component 60. The electronic component 60 includes an insulator substrate 62. Two recesses 64 are formed in each of the opposing end portions of the insulator substrate 62. Two pattern electrodes 66 and 68 are disposed on one main surface of the insulator substrate 62. One of the pattern electrodes 66 is formed between the opposing recesses 64 in a substantially L-shaped configuration from one end of the recess toward the approximate central portion of the insulator substrate 62. Also, the other pattern electrode 68 is formed between the other opposing recesses 64 in a substantially L-shaped configuration from the other end of the recess toward the approximately central portion of the insulator substrate 62. Then, near the central portion of the insulator substrate 62, the two pattern electrodes 66 and 68 are arranged so as to be opposite to each other and spaced from each other. The pattern electrodes 66 and 68 are arranged to extend around from the end portion of the insulator substrate 62 toward the other surface.

Figure 22:
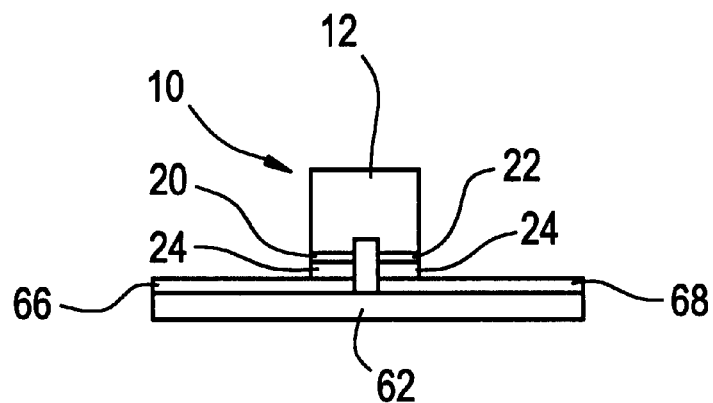
FIG. 22 is a side view showing the mounting construction of the piezoelectric resonator in the electronic component shown in FIG. 21.

As shown in FIG. 22, a support member 24 made of a conductive material, disposed at each of the approximate central portions of the external electrodes 20 and 22 of the piezoelectric resonator 10, is connected by, for example, a conductive bonding agent to the end portion of the pattern electrode 66 and the pattern electrode 68 in the approximate central portion of the insulator substrate 62. As a result, the external electrodes 20 and 22 of the piezoelectric resonator 10 are fixed onto the insulator substrate 62 and also electrically connected to the pattern electrodes 66 and 68.

Furthermore, a metal cap 74 is put on the insulator substrate 62. At this time, an insulating resin is coated onto the insulator substrate 62 and the pattern electrodes 66 and 68 so that the metal cap 74 is not electrically connected to the pattern electrodes 66 and 68. Then, as a result of the metal cap 74 being mounted, the electronic component 60 is completed. In this electronic component 60, the pattern electrodes 66 and 68 formed in such a manner as to extend around from the end portion of the insulator substrate 62 toward the rear surface are used as input and output terminals for connection with an external circuit.

In this electronic component 60, since the piezoelectric resonator 10 is supported by the support member 24 located at the approximate central portion along the length direction of the base 12, the end portion of the piezoelectric resonator 10 is located separated and spaced from the insulator substrate 62, thereby allowing for free and unhindered vibration. Also, the approximate central portion, which is a node of the piezoelectric resonator 10, is fixed by the support member 24, and the external electrodes 20 and 22 and the pattern electrodes 66 and 68 are electrically connected to each other. Since the support member 24 is formed in the piezoelectric resonator 10 in advance, accurate positioning at the node of the piezoelectric resonator 10 can be performed. Therefore, in comparison with a case in which a projection-shaped support member is formed on the side of the pattern electrodes 66 and 68 and the piezoelectric resonator is mounted thereon, it is possible to support the node with accuracy. Therefore, leakage of vibration of the piezoelectric resonator 10 is prevented and excellent resonator characteristics are obtained. Also, the need to use a lead wire for connecting the external electrodes 20 and 22 of the piezoelectric resonator 10 to the pattern electrodes 66 and 68 is eliminated, and the electronic component 60 can be manufactured at a low cost.

Furthermore, this electronic component 60, together with ICs and the like, may be mounted in a circuit substrate, and may be used as an oscillator and a discriminator. Since the electronic component 60 of such a construction is hermetically sealed and protected by the metal cap 74, this component can be used as a chip component which can be mounted by reflow soldering or the like.

In the case where this electronic component 60 is used as an oscillator, since the above-described piezoelectric resonator 10 is used, spurious emissions are minimized, and abnormal vibrations caused by spurious emissions are prevented. Also, since the capacitance value of the piezoelectric resonator 10 can be set freely, it is easy to achieve impedance matching with an external circuit. In particular, when the component is used as an oscillation element for a voltage-controlled oscillator, since $\Delta F$ of the resonator is large, it is possible to obtain a wider variable frequency range than was previously possible.

When this electronic component 60 is used as a discriminator, the feature that $\Delta F$ of the resonator is large leads to the feature that peak separation is wide. Furthermore, since the capacitance design range of the resonator is wide, it is easy to achieve impedance matching with an external circuit.

Figure 23:
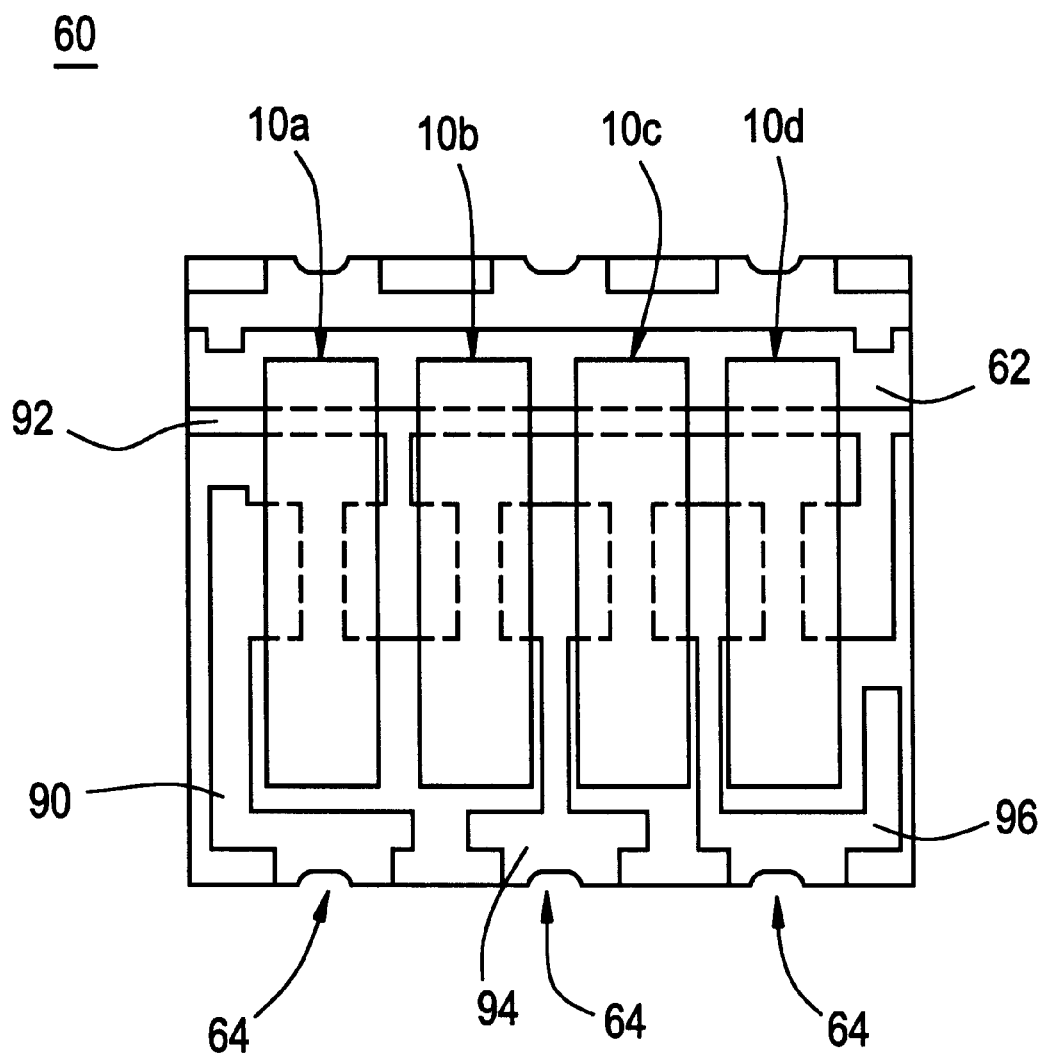
FIG. 23 is a plan view of the essential portion showing an example of a ladder filter including the piezoelectric resonator shown in FIG. 1.
Figure 24:
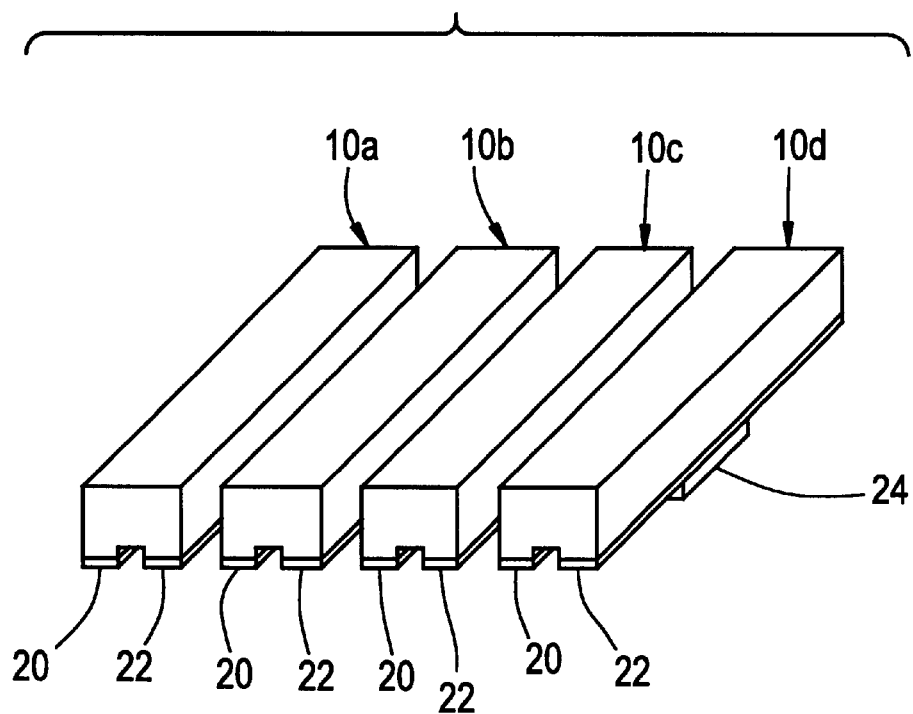
FIG. 24 is an exploded perspective view of the essential portion of the ladder filter shown in FIG. 23.
Figure 24:
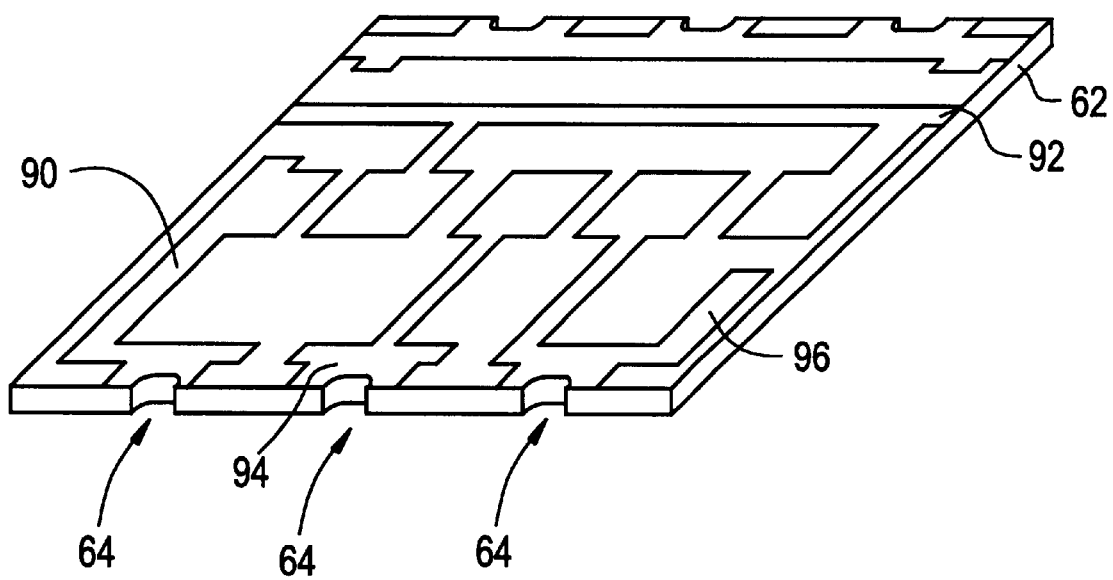

Furthermore, use of a plurality of piezoelectric resonators 10 makes it possible to manufacture a ladder filter. FIG. 23 is a plan view of the essential portion showing an example of an electronic component used as a ladder filter having a ladder-type circuit. FIG. 24 is an exploded perspective view of the essential portion thereof. In the electronic component 60 shown in FIGS. 23 and 24, four pattern electrodes 90, 92, 94, and 96 are disposed on the insulator substrate 62. Five lands disposed in one row and spaced from each other are disposed on these pattern electrodes 90 to 96. In this case, a first land from one end of the insulator substrate 62 is formed in the pattern electrode 90, a second land and a fifth land are formed in the pattern electrode 92, a third land is formed in the pattern electrode 94, and a fourth is formed in the pattern electrode 96.

The support member 24 disposed on the external electrodes 20 and 22 of the respective piezoelectric resonators 10a, 10b, 10c, and 10d is mounted on these lands. In this case, in order to construct the ladder-type circuit shown in FIG. 25, the piezoelectric resonators 10a to 10d are mounted. Then, a metal cap (not shown) is put onto the insulator substrate 62.

Figure 25:
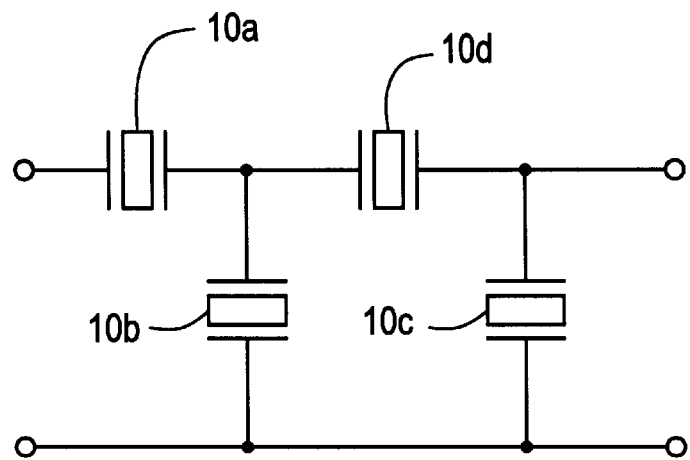
FIG. 25 is a circuit diagram of the ladder filter shown in FIG. 23.
Figure 26:
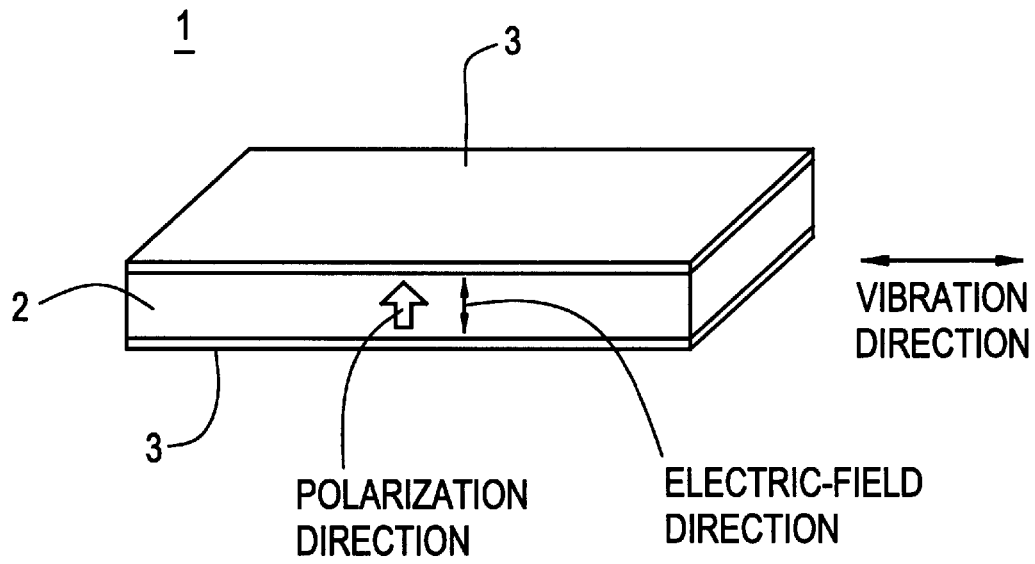
FIG. 26 is a perspective view showing an example of a conventional piezoelectric resonator relating to a background of the present invention.

This electronic component 60 is used as a ladder filter having a ladder-type circuit, such as that shown in FIG. 25. At this time, for example, two piezoelectric resonators 10a and 10d are used as series resonators and the other two piezoelectric resonators 10b and 10c are used as parallel resonators. Such a ladder filter is designed so that the capacitance of the parallel resonators 10b and 10c exceeds the capacitance of the series resonators 10a and 10d.

The attenuation of the ladder filter depends upon the capacitance ratio of the series resonator to the parallel resonator. In this electronic component 60, by varying the number of multilayers of the piezoelectric resonators 10a to 10d, the capacitance can be adjusted. Therefore, by adjusting the capacitance of the piezoelectric resonators 10a to 10d, it is possible to realize a ladder filter having a larger attenuation with a smaller number of resonators than in a case in which a conventional piezoelectric resonator utilizing a transverse piezoelectric effect is used. Also, since $\Delta F$ of the piezoelectric resonators 10a to 10d is larger than that of the conventional piezoelectric resonator, it is possible to realize a ladder filter having a wider passing bandwidth than that using a conventional piezoelectric resonator.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a resonance element, comprising the steps of:

preparing a multilayered body having a plurality of piezoelectric layers and a plurality of inner electrodes laminated to each other in a laminating direction;

forming an insulating film on a first surface of said multilayered body at exposed portions of said inner electrodes, said insulating film having a plurality of openings arranged in rows which are substantially parallel to the laminating direction of said multilayered body;

forming overlapping portions of the insulating film in a continuous manner to extend in a vertical direction with respect to the inner electrodes;

forming an external electrode on a surface on which said insulating film is formed;

forming a plurality of grooves on the surface on which said external electrode is formed; and cutting said multilayered body substantially parallel to said plurality of grooves; wherein a first group of said plurality of openings in a first of said rows are disposed on every alternate exposed portion of said inner electrodes, and a second group of said plurality of openings in a second of said rows adjacent to said first of said rows are disposed on each remaining alternate exposed portion of said inner electrodes;

said first of said rows and said second of said rows are separated from each other by a predetermined distance and one of said plurality of grooves is formed between said first of said rows and said second of said rows.

2. The method according to claim 1, wherein a relationship $0<x<(W-a)/2$ is satisfied where W is a width of said piezoelectric resonator, a is the width of said groove, and x is a dimension of said predetermined distance between said first row and said second row.

3. The method according to claim 1, wherein said external electrode is formed on substantially an entire surface on which said insulating film is formed.

4. The method according to claim 1, wherein after said step of forming said plurality of grooves, the grooves are surrounded on each side thereof by only said insulating film and do not directly contact the external electrode.

5. The method according to claim 1, wherein after said step of forming said plurality of grooves, a plurality of external electrodes are located on either side of each groove and arranged such that one of the external electrodes located on a first side one of the grooves is not opposite to another of the external electrodes.

6. The method according to claim 1, further comprising the step of forming overlapping portions of the insulating film such that the internal electrodes are not completely insulated in the overlapping portion.

7. The method according to claim 1, further comprising the step of forming overlapping portions of the insulating film and after the step of forming the plurality of grooves, the overlapping portions of the insulation film remain on both sides of each of the grooves.

8. The method according to claim 1, wherein the resonance component is an oscillator.

9. The method according to claim 1, wherein the resonance components is a discriminator.

10. A method of manufacturing a ladder filter, comprising the steps of:

preparing a multilayered body having a plurality of piezoelectric layers and a plurality of inner electrodes laminated to each other in a laminating direction;

forming an insulating film on a first surface of said multilayered body at exposed portions of said inner electrodes, said insulating film having a plurality of openings arranged in rows which are substantially parallel to the laminating direction of said multilayered body;

forming overlapping portions of the insulating film in a continuous manner to extend in a vertical direction with respect to the inner electrodes;

forming an external electrode on a surface on which said insulating film is formed;

forming a plurality of grooves on the surface on which said external electrode is formed; and cutting said multilayered body substantially parallel to said plurality of grooves to form a plurality of piezoelectric resonators; wherein a first group of said plurality of openings in a first of said rows are disposed on every alternate exposed portion of said inner electrodes, and a second group of said plurality of openings in a second of said rows adjacent to said first of said rows are disposed on each remaining alternate exposed portion of said inner electrodes;

said first of said row and said second row of said rows are separated from each other by a predetermined distance and one of said plurality of grooves is formed between said first of said rows and said second of said rows.

11. The method according to claim 10, wherein a relationship $0<x<(W-a)/2$ is satisfied where W is a width of said piezoelectric resonator, a is the width of said groove, and x is a dimension of said predetermined distance between said first row and said second row.

12. The method according to claim 10, wherein said external electrode is formed on substantially an entire surface on which said insulating film is formed.

13. The method according to claim 10, wherein after said step of forming said plurality of grooves, the grooves are surrounded on each side thereof by only said insulating film and do not directly contact the external electrode.

14. The method according to claim 10, wherein after said step of forming said plurality of grooves, a plurality of external electrodes are located on either side of each groove and arranged such that one of the external electrodes located on a first side one of the grooves is not opposite to another of the external electrodes.

15. The method according to claim 10, further comprising the step of forming overlapping portions of the insulating film such that the internal electrodes are not completely insulated in the overlapping portion.

16. The method according to claim 10, further comprising the step of forming overlapping portions of the insulating film and after the step of forming the plurality of grooves, the overlapping portions of the insulation film remain on both sides of each of the grooves.

17. The method according to claim 10, further comprising the step of mounting the plurality of piezoelectric resonators on a substrate including a plurality of pattern electrodes such that the piezoelectric resonators are connected to respective ones of the pattern electrodes.

18. The method according to claim 17, wherein the piezoelectric resonators and the pattern electrodes define a ladder circuit.

* * * * *